United States Patent
Kajita et al.

(10) Patent No.: US 10,347,388 B2
(45) Date of Patent: Jul. 9, 2019

(54) CONDUCTIVE COPPER PASTE, CONDUCTIVE COPPER PASTE CURED FILM, AND SEMICONDUCTOR DEVICE

(71) Applicant: NAMICS CORPORATION, Niigata (JP)

(72) Inventors: Masashi Kajita, Niigata (JP); Takashi Sakamoto, Niigata (JP); Shigeko Konno, Niigata (JP); Tomoyuki Takahashi, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 15/555,319

(22) PCT Filed: Feb. 29, 2016

(86) PCT No.: PCT/JP2016/056042
§ 371 (c)(1),
(2) Date: Sep. 1, 2017

(87) PCT Pub. No.: WO2016/140185
PCT Pub. Date: Sep. 9, 2016

(65) Prior Publication Data
US 2018/0061520 A1 Mar. 1, 2018

(30) Foreign Application Priority Data
Mar. 5, 2015 (JP) .................................. 2015-043245

(51) Int. Cl.
| | | |
|---|---|---|
| *C09D 11/52* | (2014.01) | |
| *H01B 1/22* | (2006.01) | |
| *H01B 5/14* | (2006.01) | |
| *H01B 13/00* | (2006.01) | |
| *H01L 23/00* | (2006.01) | |
| *H05K 3/32* | (2006.01) | |

(52) U.S. Cl.
CPC ............. *H01B 1/22* (2013.01); *H01B 5/14* (2013.01); *H01B 13/0036* (2013.01); *H01L 24/00* (2013.01); *H05K 3/321* (2013.01)

(58) Field of Classification Search
CPC ............. C09D 11/52; H01B 1/22; H01B 5/14
USPC ....................................................... 106/31.92
See application file for complete search history.

(56) References Cited

U.S. PATENT DOCUMENTS

| | | | | |
|---|---|---|---|---|
| 4,789,411 A | * | 12/1988 | Eguchi ................ | H01B 1/22 148/24 |
| 5,242,511 A | * | 9/1993 | Yokoyama ............. | H01B 1/22 148/430 |
| 5,567,357 A | * | 10/1996 | Wakita ................. | H01B 1/22 252/512 |
| 2006/0057340 A1 | * | 3/2006 | Umeda ................. | H01B 1/22 428/209 |
| 2008/0261049 A1 | | 10/2008 | Taira | |
| 2017/0044383 A1 | * | 2/2017 | Suh ..................... | H01B 1/22 |
| 2017/0140847 A1 | * | 5/2017 | Kamikoriyama ....... | H01B 1/22 |
| 2018/0233248 A1 | * | 8/2018 | Takahashi ............. | H01B 1/22 |

FOREIGN PATENT DOCUMENTS

| | | | |
|---|---|---|---|
| JP | 01/167385 | * | 7/1989 |
| JP | 02016172 | | 1/1990 |
| JP | 02016172 A | * | 1/1990 |
| JP | 03/077202 | * | 4/1991 |
| JP | 05/212579 | * | 8/1993 |
| JP | 09165606 | | 6/1997 |
| JP | 10064333 A2 | | 3/1998 |
| JP | H10/85984 A | * | 4/1998 |
| JP | 2008130301 A2 | | 6/2008 |
| JP | 2009/021149 A | * | 1/2009 |
| JP | 2009295895 A2 | | 12/2009 |
| WO | 2006013793 A1 | | 2/2006 |
| WO | WO 2017/029953 A1 | * | 2/2017 |
| WO | WO 2017/126382 A1 | * | 7/2017 |

OTHER PUBLICATIONS

English translation of JP 2009/021149, Jan. 2009; 11 pages.*
English translation of JP H10/85984, Apr. 1998; 10 pages.*
English translation of WO 2017/126382, Jul. 2017; 12 pages.*
English translation of JP 03/077202, Apr. 1991; 6 pages.*
English translation of JP 05/212579, Aug. 1993; 7 pages.*
English translation of JP 01/167385, Jul. 1989; 5 pages.*
2-Ethoxyethyl acetate solvent in PubChem; National Center for Biotechonology Information, PubChem Compound Database; CID-8095, https://pubchem.ncbi,nlm.nih.gov/compound/8095; no date available; 87 pages.*
International Search Report dated Apr. 12, 2016 filed in PCT/JP2016/056042.

* cited by examiner

*Primary Examiner* — Helene Klemanski
(74) *Attorney, Agent, or Firm* — Rankin, Hill & Clark LLP

(57) ABSTRACT

The purpose of the present invention is to provide a conductive copper paste which is curable in an ambient atmosphere, has a long pot life, and, has a low specific resistance even under a high-temperature and short-time curing condition, wherein the specific resistance after curing does not greatly vary depending on a copper powder content. The conductive copper paste provided is characterized by containing (A) a copper powder, (B) a thermosetting resin, (C) a fatty acid that is liquid at normal temperature, and (D) triethanolamine. Preferably, component (B) is a resol-type phenol resin. More preferably, the content of component (B) is 10 to 20 parts by mass with respect to a total of 100 parts by mass of component (A) and component (B).

14 Claims, No Drawings

CONDUCTIVE COPPER PASTE, CONDUCTIVE COPPER PASTE CURED FILM, AND SEMICONDUCTOR DEVICE

TECHNICAL FILED

The present invention relates to a conductive copper paste, a conductive copper paste cured film, and a semiconductor device. Particularly, the present invention relates to a conductive copper paste that can be sintered in an ambient atmosphere, a cured film of the conductive copper paste, and a semiconductor device including the conductive copper paste cured film.

BACKGROUND ART

Semiconductor devices in which an electrode portion of a semiconductor element and a conductive portion of a substrate are adhered to each other are widely being used. For the adhesion of the electrode portion of the semiconductor element and the conductive portion of the substrate, a conductive adhesive or soldering may be used. While conductive adhesive has the advantage of being able to adhere at lower temperatures than soldering, they have higher bulk resistance than solder. Accordingly, ways to decrease the resistance of conductive adhesive have been studied.

In conventional conductive adhesives, silver is used as a conductive filler. Silver, however, has a migration property, and the price of silver is rising. Accordingly, using copper as a conductive filler has been contemplated. A conductive adhesive in which copper is used is required to be adapted for curing the copper, which is easily oxidized, in an ambient atmosphere.

As an example of a paste in which copper is used as a conductive filler, a conductive copper paste has been disclosed which includes, as essential components, a copper powder having a predetermined particle size distribution and tap density, a thermosetting resin, an organic carboxylic acid, a chelate agent, and additionally polybutadiene (Patent Literature 1, claim 1 and paragraphs 0013, 0022).

The disclosure is aimed at providing a conductive copper paste suitable for a fine pitch-compatible through hole. The conductive copper paste is adapted for screen printing. In addition, the conductive copper paste has good conductivity comparable to that of a conductive silver paste, and anti-migration property (Patent Literature 1, paragraph 0008). Specific examples of the organic carboxylic acid that are listed include salicylic acid, benzoic acid, tartaric acid, citric acid, maleic acid, succinic acid, fumaric acid, and malonic acid (Patent Literature 1, paragraph 0018). These organic carboxylic acids are all solid at normal temperature.

A circuit substrate conductive paste has also been disclosed that has the following features. The circuit substrate conductive copper paste comprises a metal powder including copper, a compound including at least two (meth)acrylic groups, and a β-dicarbonyl compound, and includes substantially neither an azo compound nor peroxide (Patent Literature 2, claim 1). It is described that the circuit substrate conductive paste may include a compound having a flux activity (Patent Literature 2, paragraph 0014). As examples of the compound having a flux activity, aliphatic carboxylic acids such as oleic acid are listed (Patent Literature 2, paragraphs 0038, 0046).

A conductive copper paste composition has also been disclosed. The conductive copper paste composition contains: a prepolymer that has at least two hydroxyl groups per molecule and at least one tertiary amine; a copper powder; an amino resin: and a reducing agent. The conductive copper paste composition can be used for etching with an acidic etching solution (Patent Literature 3, claim 1). As examples of the reducing agent, unsaturated monocarboxylic acids of carbon number 12 to 23, such as oleic acid and linolic acid, are listed (Patent Literature 3, paragraph 0016 paragraph).

However, it has been discovered that these conductive copper pastes are disadvantageous in that: the specific resistance increases under a high-temperature and short-time curing condition (for example, 210° C. for 10 min); and the specific resistance of the conductive copper paste after curing varies greatly depending on the content of the copper powder.

LIST OF PRIOR ART

Patent Literature

PATENT LITERATURE 1: JP-A-2008-130301
PATENT LITERATURE 2: JP-A-2009-295895
PATENT LITERATURE 3: JP-A-H10-064333

SUMMARY OF THE INVENTION

Problems to be Solved by the Invention

The present inventors' intensive research has led to the discovery that combining a copper powder, fatty acid that is liquid at normal temperature with triethanolamine provides a conductive copper paste described below. The conductive copper paste is curable in an ambient atmosphere, and has a long pot life and low specific resistance even under a high-temperature and short-time curing condition. It has also been discovered that the specific resistance of the conductive copper paste after curing does not greatly vary depending on the content of the copper powder. Accordingly, an object of the present invention is to provide a conductive copper paste that is curable in an ambient atmosphere and has long pot life and low specific resistance after curing, wherein the specific resistance after curing does not greatly vary depending on a copper powder content.

Solution to the Problems

The present invention relates to a conductive copper paste, a conductive copper paste cured film, a method for manufacturing a conductive copper paste cured film, and a semiconductor device by which the problems are solved by adopting the following configurations.
(1) A conductive copper paste including (A) a copper powder; (B) a thermosetting resin; (C) a fatty acid that is liquid at normal temperature; and (D) triethanolamine.
(2) The conductive copper paste according to (1), wherein component (C) is at least one type selected from oleic acid, linolic acid, and linolenic acid.
(3) The conductive copper paste according to (1) or (2), wherein component (B) is a resol-type phenol resin.
(4) The conductive copper paste according to any one of (1) to (3), wherein component (B) has a content of 10 to 20 parts by mass with respect to a total of 100 parts by mass of component (A) and component (B).
(5) The conductive copper paste according any one of (1) to (4), wherein component (C) has a content of 0.8 to 3 parts by mass with respect to a total of 100 parts by mass of component (A) and component (B).
(6) The conductive copper paste according to any one of (1) to (5), wherein component (D) has a content of 1 to 5 parts by mass with respect to a total of 100 parts by mass of component (A) and component (B).

(7) The conductive copper paste according to any one of (1) to (6), having an initial viscosity in a range of 8 to 12 Pa·s.

(8) The conductive copper paste according to any one of (1) to (7), wherein, when held at 25° C., the time required for reaching a viscosity more than or equal to 1.2 times the initial viscosity is one week or more.

(9) A conductive copper paste cured film comprising a cured material of the conductive copper paste according to any one of (1) to (8).

(10) A method for manufacturing a conductive copper paste cured film, the method comprising screen-printing the conductive copper paste according to any one of (1) to (8) on a substrate, and thereafter heating under ambient atmosphere at 200 to 220° C. for 5 to 15 minutes.

(11) A semiconductor device comprising the conductive copper paste cured film according to (9).

Effects of the Invention

According to the present invention (1), there is provided a conductive copper paste which is curable in an ambient atmosphere and has a long pot life and a low specific resistance value even under a high-temperature and short-time curing condition, wherein the specific resistance after curing does not greatly vary depending on the content of copper powder (specific resistance value is less than $1 \times 10^{-4}$ Ω·cm).

According to the present invention (9), a conductive copper paste cured film for obtaining a high reliability semiconductor device is provided. According to the present invention (10), a conductive copper paste cured film for obtaining a high reliability semiconductor device can be simply obtained by heating under ambient atmosphere. According to the present invention (11), there is obtained, for example, a high reliability semiconductor device in which the connection resistance value between an electrode portion of a semiconductor element and a conductive portion of a substrate is small.

DESCRIPTION OF THE EMBODIMENTS (Conductive Copper Paste)

A conductive copper paste according to the present invention characteristically contains (A) a copper powder, (B) a thermosetting resin, (C) a fatty acid that is liquid at normal temperature, and (D) triethanolamine.

The copper powder (A) affords a cured conductive copper paste with conductivity. Examples of component (A) include copper powders in bar shape, flake shape, and spherical shape. From the viewpoint of the specific resistance of the conductive copper paste after curing, copper powder in bar shape and copper powder in flake shape are preferable. More preferably, component (A) is copper powder in bar shape obtained by disintegrating particle-shaped dendritic copper powder (electrolytic copper powder), and even more preferably copper powder in bar shape having a surface processed with a fatty acid, particularly oleic acid. Commercially available examples of component (A) include an electrolytic copper powder (ECY) manufactured by MITSUI MINING & SMELTING CO., LTD., and more preferably an electrolytic copper powder having a surface processed with a fatty acid, particularly oleic acid (10% particle diameter: 3.4 μm, 50% particle diameter: 8.1 μm, 90% particle diameter: 15.2 μm, tap density: 4.4 g/cm³). The particle diameter is measured by a laser diffraction scattering particle distribution measurement device. The tap density is measured by a shaking specific gravity meter (tap machine). Component (A) may be used singly, or two or more kinds of component (A) may be used in combination.

The thermosetting resin component (B) affords the conductive copper paste with adhesiveness and curability. Component (B), from the viewpoint of thermosetting shrinkage and adhesion, is preferably a phenol resin and more preferably a resol-type phenol resin. A commercially available example of component (B) is a resol-type phenol resin manufactured by SHOWA DENKO K.K. (product name: CKM-918A). Component (B) may be used singly, or two or more kinds of component (B) may be used in combination. In order to prepare a paste, a solid resin, such as resol-type phenol resin, may be used in liquid form obtained by being heated and mixed with a solvent serving as component (E) as will be described later.

Component (C) functions as a flux component for eluting an oxide layer of the copper powder surface. Herein, "normal temperature" refers to 25° C. Component (C), being liquid, increases the uniformity of the conductive copper paste. As a result, it is believed that increased wettability on the surface of the copper powder of component (A) is obtained. Preferably, component (C) is an unsaturated fatty acid having the carbon=carbon double bond. Examples of component (C) include: Oleic acid ($CH_3(CH_2)_7CH=CH(CH_2)_7COOH$, cis-9-octadecenoic acid); Linolic acid ($CH_3-(CH_2)_4-CH=CHCH_2CH=CH(CH_2)_7COOH$, cis-9, cis-12-octadecadienoic acid): and Linolenic acid ($CH_3CH_2CH=CHCH_2CH=CH CH_2CH=CH(CH_2)_7COOH$, cis-9,cis-12,cis-15-octadecatrienoic acid). A more preferable example is oleic acid. Component (C) may be used singly. Two or more kinds of component (C) may be used in combination.

The triethanolamine (TEA, $N(CH_2CH_2OH)_3$) component (D) immobilizes the copper ion eluted by the flux effect of component (C), and suppresses the action of the carboxyl group of the fatty acid under room temperature (25° C.).

The content of component (A), from the viewpoint of curability of the conductive copper paste and the specific resistance of the conductive copper paste after curing, is preferably 80 to 90 parts by mass and more preferably 87.5 parts by mass with respect to a total of 100 parts by mass of component (A) and component (B).

The content of component (A), also in the case of a cured material of the conductive copper paste, is more preferably 80 to 90 parts by mass and particularly preferably 87.5 parts by mass with respect to a total of 100 parts by mass of component (A) and component (B). The conductive copper paste has a small mass decrease upon curing of less than 1%. Accordingly, the preferable content of component (A) in the cured material is the same as the content of component (A) before curing. Quantitative analysis for component (A) is performed using a thermogravimetric analyzer.

The content of component (B), from the viewpoint of curability of the conductive copper paste and the specific resistance of the conductive copper paste after curing, is preferably 10 to 20 parts by mass and particularly preferably 12.5 parts by mass with respect to a total of 100 parts by mass of component (A) and component (B).

The content of component (B), also in the case of a cured material of the conductive copper paste, with respect to a total of 100 parts by mass of component (A) and component (B), is preferably 10 to 20 parts by mass and particularly preferably 12.5 parts by mass. Quantitative analysis for component (B) is performed using an ion chromatograph-mass analysis device.

The content of component (C) with respect to a total of 100 parts by mass of component (A) and component (B) is preferably 0.8 to 3 parts by mass and more preferably 1 part by mass. If the content of component (C) is less than 0.8 part by mass, the specific resistance value of the copper paste cured film tends to become high. If the content of component (C) is greater than 3 parts by mass, the pot life of the copper paste tends to become shorter.

The content of component (C), also in the case of a cured material of the conductive copper paste, with respect to a total of 100 parts by mass of component (A) and component (B) is preferably 0.8 to 3 parts by mass. Quantitative analysis for component (C) is performed using an ion chromatograph-mass analysis device.

The content of component (D) with respect to a total of 100 parts by mass of component (A) and component (B) is preferably 1 to 5 parts by mass and more preferably 3 parts by mass. If the content of component (D) is less than 1 part by mass, the pot life of the copper paste tends to become shorter. If the content of component (D) is greater than 5 parts by mass, the specific resistance value of the copper paste cured film tends to become high.

In the conductive copper paste, from the viewpoint of melting and liquidation in the case of component (B) in solid form, and of viscosity adjustment of the conductive copper paste, a solvent may be used as component (E). Component (E) may be selected as appropriate in consideration of the solubility and curing condition of the thermosetting resin. Specific examples include ethyl carbitol, ethyl carbitol acetate, butylcarbitol, butylcarbitol acetate, terpineol, dihydro terpineol, ethylcellosolve, butyl cellosolve, ethylcellosolve acetate, and butyl cellosolve acetate. When component (B) is a phenol resin, butylcarbitol may preferably be used.

The content of component (E) is preferably 10 to 20 parts by mass with respect to 100 parts by mass of the conductive copper paste.

In the conductive copper paste of the present invention, there may be additionally compounded, as necessary, additives such as a leveling agent, a coloring agent, an ion trapping agent, an antifoaming agent, and a flame retardant, to the extent that the purpose of the present invention would not be adversely affected.

The conductive copper paste of the present invention can be obtained, for example, by stirring, melting, mixing, and dispersing component (A) to component (D) and other additives, simultaneously or separately, while performing a heating process as needed. The devices for the mixing, stirring, dispersing and the like are not particularly limited. For example, an automated mortar, triple roll mill, ball mill, planetary mixer, or bead mill equipped with a stirrer and heating device may be used. These devices may, as appropriate, be used in combination.

From the viewpoint of screen printability, the initial viscosity of the conductive copper paste is preferably in a range of 8 to 12 Pa·s. The initial viscosity of the conductive copper paste is measured with a Brookfield (B-type) viscometer at 25° C. and 50 rotations, within one hour after preparation of the conductive copper paste.

With regard to the pot life of the conductive copper paste, preferably the time required for reaching a viscosity more than or equal to 1.2 times the initial viscosity when held at room temperature (25° C.) is six days or more.

The conductive copper paste of the present invention is formed or coated in a desired position of an electronic component, such as a conductive portion of a substrate or an electrode portion of a semiconductor element, by screen printing or with a dispenser.

The curing condition for the conductive copper paste of the present invention is preferably 150 to 300° C. for 5 to 30 minutes under ambient atmosphere. Particularly, a high-temperature and short-time condition of 200 to 220° C. for 5 to 15 minutes is suitable. A conductive copper paste cured film that is the cured material of the conductive copper paste has a low specific resistance. A method for manufacturing a conductive copper paste cured film according to the present invention is characterized in that the conductive copper paste is heated at 200 to 220° C. for 5 to 15 minutes under ambient atmosphere after being screen-printed on a substrate.

The conductive copper paste of the present invention may be preferably used as an adhesive for an electronic component, such as an electrode portion of a semiconductor element or a conductive portion of a substrate.

(Semiconductor Device)

A semiconductor device according to the present invention includes the conductive copper paste cured film. The semiconductor device comprises, for example, a substrate having a conductive portion, and a semiconductor element having an electrode portion. The conductive portion of the substrate and the electrode portion of the semiconductor element are bonded by the conductive copper paste cured film that is the cured material of the conductive copper paste.

The semiconductor device of the present invention has a small connection resistance value between the electrode portion of the semiconductor element and the conductive portion of the substrate. Accordingly, the semiconductor device of the present invention has high reliability.

EXAMPLES

The present invention will be described with reference to Examples. The present invention, however, is not limited to the Examples. In the following description of Examples, "parts and %" indicate "parts by mass and mass % unless otherwise specified.

In the Examples and Comparative Examples:

As component (A), an oleic acid surface-processed electrolytic copper powder manufactured by MITSUI MINING & SMELTING CO., LTD. (10% particle diameter: 3.4 μm, 50% particle diameter: 8.1 μm, 90% particle diameter: 15.2 μm, tap density: 4.4 g/cm$^3$) was used.

As component (B), a resol-type phenol resin manufactured by SHOWA DENKO K.K. (product name: CKM-918A) was used.

As component (C), oleic acid, linolic acid, and linolenic acid manufactured by Wako Pure Chemical Industries, Ltd. were used.

As alternative components to component (C) (solid at room temperature), palmitic acid ($CH_3(CH_2)_{14}COOH$(hexadecanoic acid), and stearic acid ($CH_3(CH_2)_{16}COOH$(octadecanoic acid) manufactured by Wako Pure Chemical Industries, Ltd. were used.

As component (D), triethanolamine (TEA, product name: 2,2',2"-nitrilotriethanol) manufactured by Wako Pure Chemical Industries, Ltd. was used.

As alternative components to component (D), imidazole (2-phenyl-4,5-dihydroxy methylimidazole, product name: 2PHZ-PW) manufactured by SHIKOKU CHEMICALS CORPORATION, and monoethanol amine (MEA, NH2CH2CH2OH, product name: 2-aminoethanol) and diethanolamine (DEA, $NH(CH_2CH_2OH)_2$, product name: 2,2'-iminodiethanol) manufactured by Wako Pure Chemical Industries, Ltd. were used.

As component (E), butylcarbitol ($CH_3(CH_2)_3O(CH_2)_2O(CH_2)_2OH$, 2-(2-buthoxyethoxy) ethanol or diethylene glycol monobutyl ether) manufactured by Shell Chemicals Japan Ltd. was used.

(Evaluation Method)
(Initial Viscosity Measurement)

After the conductive copper paste was prepared, within one hour, the initial viscosity of the conductive copper paste was measured using a Brookfield (B-type) viscometer at 25° C. and 50 rotations.

(Measurement of Pot Life)

The conductive copper paste was held at 25° C., and the viscosity was measured at 24-hour intervals using a Brookfield (B-type) viscometer at 25° C. and 50 rotations. The time required before the measurement value became 1.2 times (an increase of 20%) or more of the initial value was measured.

(Measurement of Specific Resistance Value)

On an alumina substrate, a pattern with a width of 1 mm and a length 71 mm was printed using the conductive copper paste and a screen printing machine. The printed pattern was subjected to a heating process using a blasting constant-temperature drier in ambient atmosphere for 210° C.×10 minutes, and thereby cured. The film thickness of the obtained conductive copper paste cured film was measured using a surface texture and contour measuring instrument (model number: Surfcom 1500SD-2) manufactured by TOKYO SEIMITSU CO., LTD. The resistance value of the cured film was measured using a digital multimeter (model number: 2001) manufactured by TFF Keithley Instruments Inc. The volume resistivity was calculated as a specific resistance value.

Example 1

87.5 parts by mass of an oleic acid surface-processed electrolytic copper powder as component (A) and 12.5 parts of a resol-type phenol resin as component (B) were heated and melted in 10.2 parts of butylcarbitol as component (E). The resultant melted material, 1 part of oleic acid as component (C), and 3 parts of triethanolamine as component (D) were uniformly kneaded in a triple roll mill. In this way, a conductive copper paste was prepared. The pot life of the conductive copper paste was eight days. The specific resistance value of the conductive copper paste cured film was $5.6 \times 10^{-5}$ Ω·cm.

Example 2

A conductive copper paste was prepared by the same method as in Example 1 with the exception that the melted material used was obtained by heating and melting 85 parts by mass of the oleic acid surface-processed electrolytic copper powder and 15 parts of the resol-type phenol resin in 12.3 parts of butylcarbitol. The specific resistance value of the conductive copper paste cured film was $9.6 \times 10^{-5}$ Ω·cm. The pot life was not measured.

Example 3

A conductive copper paste was prepared in the same way as in Example 1 with the exception that the melted material used was obtained by heating and melting 90 parts by mass of the oleic acid surface-processed electrolytic copper powder and 10 parts of the resol-type phenol resin in 8.2 parts of butylcarbitol. The specific resistance value of the conductive copper paste cured film was $6.4 \times 10^{-5}$ Ω·cm. The pot life was not measured.

Example 4

A conductive copper paste was prepared by the same method as in Example 1 with the exception that, as component (C), 3 parts of oleic acid was used. The pot life of the conductive copper paste was seven days. The specific resistance value of the conductive copper paste cured film was $5.9 \times 10^{-5}$ Ω·cm.

Example 5

A conductive copper paste was prepared by the same method as in Example 1 with the exception that, as component (D), 1 part of triethanolamine was used. The pot life of the conductive copper paste was six days. The specific resistance value of the conductive copper paste cured material was $8.6 \times 10^{-5}$ Ω·cm.

Example 6

A conductive copper paste was prepared by the same method as in Example 1 with the exception that, as component (C), 1 part of linolic acid was used. The pot life of the conductive copper paste was seven days. The specific resistance value of the conductive copper paste cured film was $6.0 \times 10^{-5}$ Ω·cm.

Example 7

A conductive copper paste prepared by the same method as in Example 1 with the exception that, as component (C), 1 part of linolenic acid was used. The pot life of the conductive copper paste was eight days. The specific resistance value of the conductive copper paste cured film was $5.9 \times 10^{-5}$ Ω·cm.

Comparative Example 1

A conductive copper paste was prepared by the same method as in Example 1 with the exception that neither oleic acid nor triethanolamine were added. The pot life of the conductive copper paste was eight days. The specific resistance value of the conductive copper paste cured film was $7.1 \times 10^{-4}$ Ω·cm.

Comparative Example 2

A conductive copper paste was prepared by the same method as in Example 1 with the exception that triethanolamine was not added. The pot life of the conductive copper paste was less than a day. The specific resistance value of the copper paste cured film was $2.9 \times 10^{-4}$ Ω·cm.

Comparative Example 3

A conductive copper paste was prepared by the same method as in Example 1 with the exception that oleic acid was not added. The pot life of the conductive copper paste was 12 days. The specific resistance value of the copper paste cured film was $4.7 \times 10^{-4}$ cm.

Comparative Example 4

A conductive copper paste was prepared by the same method as in Example 1 with the exception that, instead of component (D), imidazole (2-phenyl-4,5-dihydroxy methylimidazole, product name: 2PHZ-PW) was used. The pot life of the conductive copper paste was less than a day. The specific resistance value of the copper paste cured film was $1.8 \times 10^{-4}$ Ω·cm.

Comparative Example 5

A conductive copper paste was prepared by the same method as in Example 1 with the exception that, instead of component (C), 1 part of palmitic acid, which is a solid fatty acid at room temperature, was used. The pot life of the conductive copper paste was four days. The specific resistance value of the conductive copper paste cured film was $7.5 \times 10^{-5}$ Ω·cm.

Comparative Example 6

A conductive copper paste was prepared by the same method as in Example 1 with the exception that, instead of component (C), 1 part of stearic acid, which is a solid fatty acid at room temperature, was used. The pot life of the conductive copper paste was two days. The specific resistance value of the conductive copper paste cured film was $6.7 \times 10^{-5}$ Ω·cm.

Comparative Example 7

A conductive copper paste was prepared by the same method as in Example 1 with the exception that, instead of component (D), 3 parts of monoethanol amine (MEA) was used. The pot life of the conductive copper paste was less than a day. The specific resistance value of the conductive copper paste cured film was $1.4 \times 10^{-4}$ Ω·cm.

Comparative Example 8

A conductive copper paste was prepared by the same method as in Example 1 with the exception that, instead of component (D), 3 parts of diethanolamine (DEA) was used. The pot life of the conductive copper paste was one day. The specific resistance value of the conductive copper paste cured film was $9.2 \times 10^{-5}$ Ω·cm.

TABLE 1

| | Component (A) (parts by mass) | Component (B) (parts by mass) | Component (C) type | Component (C) (Parts by mass) | Component (D) type | Component (D) (Parts by mass) | Specific resistance value (unit: Ω·cm) | Pot life |
|---|---|---|---|---|---|---|---|---|
| Example 1 | 87.5 | 12.5 | Oleic acid | 1.0 | TEA | 3.0 | $5.6 \times 10^{-5}$ | 8 days |
| Example 2 | 85.0 | 15.0 | Oleic acid | 1.0 | TEA | 3.0 | $9.6 \times 10^{-5}$ | — |
| Example 3 | 90.0 | 10.0 | Oleic acid | 1.0 | TEA | 3.0 | $6.4 \times 10^{-5}$ | — |
| Example 4 | 87.5 | 12.5 | Oleic acid | 3.0 | TEA | 3.0 | $5.9 \times 10^{-5}$ | 7 days |
| Example 5 | 87.5 | 12.5 | Oleic acid | 1.0 | TEA | 1.0 | $5.6 \times 10^{-5}$ | 6 days |
| Example 6 | 87.5 | 12.5 | Linolic acid | 1.0 | TEA | 3.0 | $6.0 \times 10^{-5}$ | 7 days |
| Example 7 | 87.5 | 12.5 | Linolenic acid | 1.0 | TEA | 3.0 | $5.9 \times 10^{-5}$ | 8 days |
| Comparative Example 1 | 87.5 | 12.5 | — | 0.0 | — | 0.0 | $7.1 \times 10^{-4}$ | 8 days |
| Comparative Example 2 | 87.5 | 12.5 | Oleic acid | 1.0 | — | 0.0 | $2.9 \times 10^{-4}$ | Less than 1 day |
| Comparative Example 3 | 87.5 | 12.5 | — | 0.0 | TEA | 3.0 | $4.7 \times 10^{-4}$ | 12 days |
| Comparative Example 4 | 87.5 | 12.5 | Oleic acid | 1.0 | imidazole | 3.0 | $1.8 \times 10^{-4}$ | Less than 1 day |
| Comparative Example 5 | 87.5 | 12.5 | palmitic acid | 1.0 | TEA | 3.0 | $7.5 \times 10^{-5}$ | 4 days |
| Comparative Example 6 | 87.5 | 12.5 | stearic acid | 1.0 | TEA | 3.0 | $6.7 \times 10^{-5}$ | 2 days |
| Comparative Example 7 | 87.5 | 12.5 | Oleic acid | 1.0 | MED | 3.0 | $1.4 \times 10^{-4}$ | Less than 1 day |
| Comparative Example 8 | 87.5 | 12.5 | Oleic acid | 1.0 | DEA | 3.0 | $9.2 \times 10^{-5}$ | 1 day |

Examples 8 to 10, Comparative Examples 9 to 11

The present invention and the invention disclosed in Patent Literature 1 were compared and tested. Conductive copper pastes were prepared by the same method as in Example 1 with the exception that the compositions shown in Table 2 were adopted. The specific resistance values of the prepared conductive copper paste cured films were measured. The results are shown in Table 2.

contrast, in Comparative Example 1, which included neither component (C) nor component (D), the specific resistance value was high. In Comparative Example 2, which did not include component (D), the specific resistance value was high and the pot life was short. In Comparative Example 3, which did not include component (C), the specific resistance value was high. In Comparative Example 4, in which imidazole was used instead of component (D), the specific resistance value was high and the pot life was short. In

TABLE 2

| | | Example 8 | Comparative Example 9 | Example 9 | Comparative Example 10 | Example 10 | Comparative Example 11 |
|---|---|---|---|---|---|---|---|
| Component (A) | Copper powder [1] | 85 | 85 | 87.5 | 87.5 | 90 | 90 |
| Component (B) | Resol-type phenol resin [2] | 15 | 15 | 12.5 | 12.5 | 10 | 10 |
| Component (C) | Oleic acid [3] | 1 | 0 | 1 | 0 | 1 | 0 |
| Component (C') | Benzoic acid [4] | 0 | 0.70 | 0 | 0.70 | 0 | 0.70 |
| Component (D) | Triethanol amine [5] | 3 | 0 | 3 | 0 | 3 | 0 |
| Others | Acetylacetone [6] | 0 | 1.74 | 0 | 1.74 | 0 | 1.74 |
| | Epoxidized polybutadiene [7] | 0 | 0.70 | 0 | 0.70 | 0 | 0.70 |
| Evaluation | Specific resistance value ($\mu\Omega \cdot cm$) | 96.7 | 3614.6 | 55.7 | 243.8 | 63.5 | 2494.1 |

[1] Oleic acid surface-processed electrolytic powder (50% particle diameter: 8.1 μm) manufactured by MITSUI MINING & SMELTING CO., LTD.
[2] Resol-type phenol product (product name: CKM-918A) manufactured by SHOWA DENKO K.K.
[3] Oleic acid manufactured by Wako Pure Chemical Industries, Ltd.
[4] Benzoic acid manufactured by Tokyo Chemical Industry Co., Ltd.
[5] Triethanolamine (product name: 2,2',2"-nitro triethanol) manufactured by Wako Pure Chemical Industries, Ltd.
[6] Acetylacetone from Wako Pure Chemical Industries, Ltd.
[7] Epoxidized polyethylene (product name: JP-100, epoxy equivalent: 190 to 210/eq) manufactured by Nippon Soda Co., Ltd.

Examples 11 to 14

Conductive copper pastes were prepared by the same method as in Example 1 with the exception that the compositions shown in Table 3 were adopted, and then evaluations were performed. As component (A)-2 in Example 14, a liquid phase reducing spherical copper powder manufactured by NAMICS CORPORATION (prepared by the method described in JP-A-H9-165606: an average particle diameter was 6 μm) was used. Table 3 shows the results of specific resistance and pot life.

Comparative Example 5, in which palmitic acid was used instead of component (C), the pot life was short. In Comparative Example 6, in which stearic acid was used instead of component (C), the pot life was short. In Comparative Example 7, in which MEA was used instead of component (D), the specific resistance value was high and the pot life was short. In Comparative Example 8, in which DEA was used instead of component (D), the pot life was short.

As will be seen from Table 2, in all of Examples 8 to 10, in which the content of component (A) with respect to a total of 100 parts by mass of component (A) and component (B)

TABLE 3

| | Component (A) (parts by mass) | Component (A)-2 (parts by mass) | Component (B) (parts by mass) | Component (C) Type | (Parts by mass) | Component (D) Type | (Parts by mass) | Specific resistance value (unit: $\Omega \cdot cm$) | Pot life |
|---|---|---|---|---|---|---|---|---|---|
| Example 11 | 87.5 | 0 | 12.5 | Oleic acid | 0.8 | TEA | 3.0 | $8.6 \times 10^{-5}$ | 8 days |
| Example 12 | 87.5 | 0 | 12.5 | Oleic acid | 0.9 | TEA | 3.0 | $8.0 \times 10^{-5}$ | 8 days |
| Example 13 | 87.5 | 0 | 12.5 | Oleic acid | 1.0 | TEA | 5.0 | $7.3 \times 10^{-5}$ | 12 days |
| Example 14 | 0 | 90.0 | 10.0 | Oleic acid | 1.0 | TEA | 3.0 | $9.8 \times 10^{-3}$ | 9 days |

As will be seen from Table 1, in all of Examples 1 to 7, the specific resistance values when cured in ambient atmosphere at a high temperature and for a short time were less than $1 \times 10^{-4}$ $\Omega \cdot cm$, and the pot life was six days or more. In was 85 to 90 parts, the specific resistance value was less than $1 \times 10^{-4}$ $\Omega \cdot cm$. In contrast, in Comparative Examples 9 to 11, the specific resistance greatly varied depending on the content of component (A). Specifically, even in Comparative Example 10 that exhibited the smallest specific resistance, the specific resistance was 2.438×10$^{-4}$ Ω·cm.

As will be seen from Table 3, in all of Examples 11 to 14, the specific resistance values when cured in ambient atmosphere at a high temperature and for a short time were less than 1×10$^{-4}$ Ω·cm, and the pot life was six days or more.

As described above, the conductive copper paste of the present invention is curable in ambient atmosphere, and has a long pot life and a low specific resistance value even under a high-temperature and short-time curing condition. In addition, the specific resistance after curing does not greatly vary depending on the content of copper powder. Accordingly, the conductive copper paste of the present invention is very useful.

The invention claimed is:

1. A conductive copper paste comprising:
   (A) a copper powder having a bar shape, a surface of the copper powder being processed with oleic acid;
   (B) a thermosetting resin;
   (C) a fatty acid that is liquid at normal temperature;
   (D) triethanolamine; and
   (E) a solvent selected from a group consisting of ethyl carbitol, ethyl carbitol acetate, terpineol, dihydro terpineol, ethylcellosolve, ethylcellosolve acetate and butyl cellosolve acetate, wherein a content of the component (E) is 10 to 20 parts by mass with respect to 100 parts by mass of the conductive copper paste.

2. The conductive copper paste according to claim 1, wherein component (C) is at least one type selected from oleic acid, linolic acid, and linolenic acid.

3. The conductive copper paste according to claim 1, wherein component (B) is a resol-type phenol resin.

4. The conductive copper paste according to claim 1, wherein component (B) has a content of 10 to 20 parts by mass with respect to a total of 100 parts by mass of component (A) and component (B).

5. The conductive copper paste according claim 1, wherein component (C) has a content of 0.8 to 3 parts by mass with respect to a total of 100 parts by mass of component (A) and component (B).

6. The conductive copper paste according to claim 1, wherein component (D) has a content of 1 to 5 parts by mass with respect to a total of 100 parts by mass of component (A) and component (B).

7. The conductive copper paste according to claim 1, having an initial viscosity in a range of 8 to 12 Pa·s at 25° C.

8. The conductive copper paste according to claim 1, wherein, when held at 25° C., the time required for reaching a viscosity more than or equal to 1.2 times the initial viscosity is one week or more.

9. The conductive copper paste according to claim 2, wherein component (B) is a resol-type phenol resin.

10. The conductive copper paste according to claim 2, wherein component (B) has a content of 10 to 20 parts by mass with respect to a total of 100 parts by mass of component (A) and component (B).

11. The conductive copper paste according to claim 2, wherein component (C) has a content of 0.8 to 3 parts by mass with respect to a total of 100 parts by mass of component (A) and component (B).

12. The conductive copper paste according to claim 2, wherein component (D) has a content of 1 to 5 parts by mass with respect to a total of 100 parts by mass of component (A) and component (B).

13. The conductive copper paste according to claim 2, having an initial viscosity in a range of 8 to 12 Pa·s at 25° C.

14. The conductive copper paste according to claim 2, wherein, when held at 25° C., the time required for reaching a viscosity more than or equal to 1.2 times the initial viscosity is one week or more.

* * * * *